(12) United States Patent
Ramirez Muela et al.

(10) Patent No.: US 11,884,021 B2
(45) Date of Patent: Jan. 30, 2024

(54) MODIFYING OBJECT GEOMETRIES BASED ON RADIANT HEATING DISTRIBUTION

(71) Applicant: Hewlett-Packard Development Company, L.P., Spring, TX (US)

(72) Inventors: David Ramirez Muela, Sant Cugat del Valles (ES); Manuel Freire Garcia, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 432 days.

(21) Appl. No.: 17/267,400

(22) PCT Filed: Oct. 9, 2018

(86) PCT No.: PCT/US2018/055011
§ 371 (c)(1),
(2) Date: Feb. 9, 2021

(87) PCT Pub. No.: WO2020/076304
PCT Pub. Date: Apr. 16, 2020

(65) Prior Publication Data
US 2021/0299968 A1    Sep. 30, 2021

(51) Int. Cl.
*B29C 64/393*    (2017.01)
*B29C 64/153*    (2017.01)
*B29C 64/295*    (2017.01)
*G06F 30/17*    (2020.01)

(52) U.S. Cl.
CPC .......... *B29C 64/393* (2017.08); *B29C 64/153* (2017.08); *B29C 64/295* (2017.08); *G06F 30/17* (2020.01)

(58) Field of Classification Search
CPC ...... B29C 64/393; B29C 64/153; G06F 30/17
See application file for complete search history.

(56) References Cited

U.S. PATENT DOCUMENTS

| 6,406,658 B1 | 6/2002 | Manners et al. |
| 7,149,596 B2 | 12/2006 | Berger et al. |
| 8,874,248 B2 | 10/2014 | Young et al. |
| 9,522,426 B2 | 12/2016 | Das et al. |
| 10,073,424 B2 | 9/2018 | Lin et al. |

(Continued)

FOREIGN PATENT DOCUMENTS

| EP | 1270184 B1 | 7/2005 |
| WO | WO-2017157455 A1 | 9/2017 |

OTHER PUBLICATIONS

Wei Z, Lee KM, Zhou Z, Hong SP. Modeling of advanced melting zone for manufacturing of optical fibers. J. Manuf. Sci. Eng.. Nov. 1, 2004; 126(4):750-9. (Year: 2004).*

*Primary Examiner* — Chuen-Meei Gan
(74) *Attorney, Agent, or Firm* — Michael Dryja

(57) ABSTRACT

In an example, object model data representing at least a portion of an object defining an initial object geometry is received, wherein the object is to be generated by an additive manufacturing apparatus by fusing build material using a radiant heater. Based on a non-uniform radiant heating distribution of the additive manufacturing apparatus, a modified object geometry may be determined, wherein a local modification of the object geometry is determined based on a local radiant heating parameter determined from the non-uniform radiant heating distribution.

11 Claims, 9 Drawing Sheets

(56) References Cited

U.S. PATENT DOCUMENTS

| | | | |
|---|---|---|---|
| 2016/0082547 A1* | 3/2016 | Szwedowicz | B22F 12/17 |
| | | | 700/98 |
| 2016/0224017 A1 | 8/2016 | Huang et al. | |
| 2017/0151722 A1 | 6/2017 | Prasad et al. | |
| 2017/0217095 A1 | 8/2017 | Buller et al. | |
| 2017/0334144 A1 | 11/2017 | Fish et al. | |
| 2018/0086003 A1 | 3/2018 | Greene et al. | |
| 2018/0095450 A1* | 4/2018 | Lappas | G06T 19/00 |

* cited by examiner

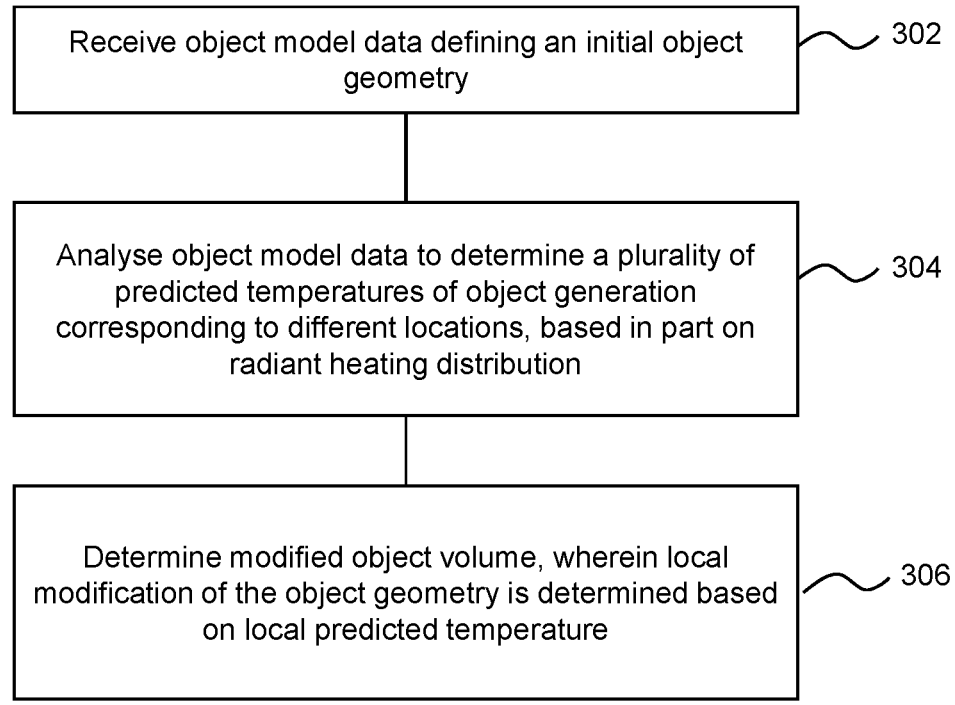
Fig. 3
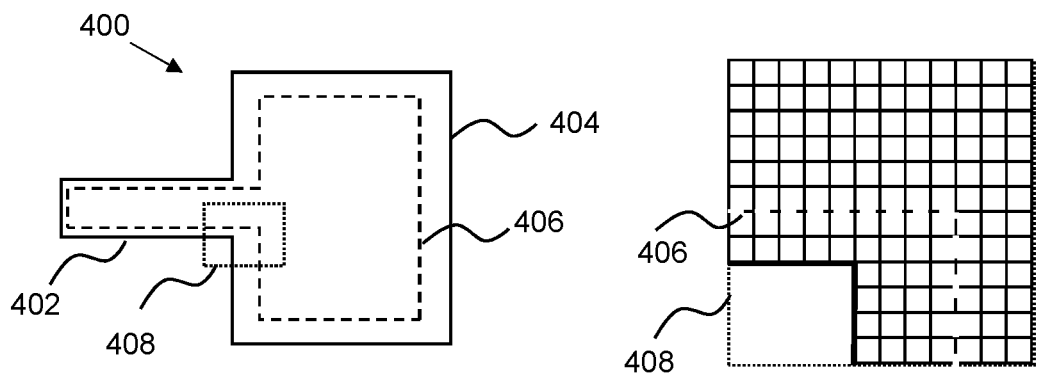
Fig. 4A
Fig. 4B

MODIFYING OBJECT GEOMETRIES BASED ON RADIANT HEATING DISTRIBUTION

CROSS-REFERENCE TO RELATED APPLICATION

Pursuant to 35 U.S.C. § 371, this application is a United States National Stage Application of PCT Patent Application Serial No. PCT/US2018/055011, filed on Oct. 9, 2018, the contents of which are incorporated by reference as if set forth in their entirety herein.

BACKGROUND

Additive manufacturing techniques may generate a three-dimensional object through the solidification of a build material, for example on a layer-by-layer basis. In examples of such techniques, build material may be supplied in a layer-wise manner and the solidification method may include heating the layers of build material to cause melting in selected regions. In other techniques, chemical solidification methods may be used.

BRIEF DESCRIPTION OF DRAWINGS

Non-limiting examples will now be described with reference to the accompanying drawings, in which:

FIG. 3 is a flowchart of an example method of processing data for use in additive manufacturing;

FIGS. 4A and 4B show an example of a slice of an object model having a modified perimeter;

DETAILED DESCRIPTION

Figure 1:
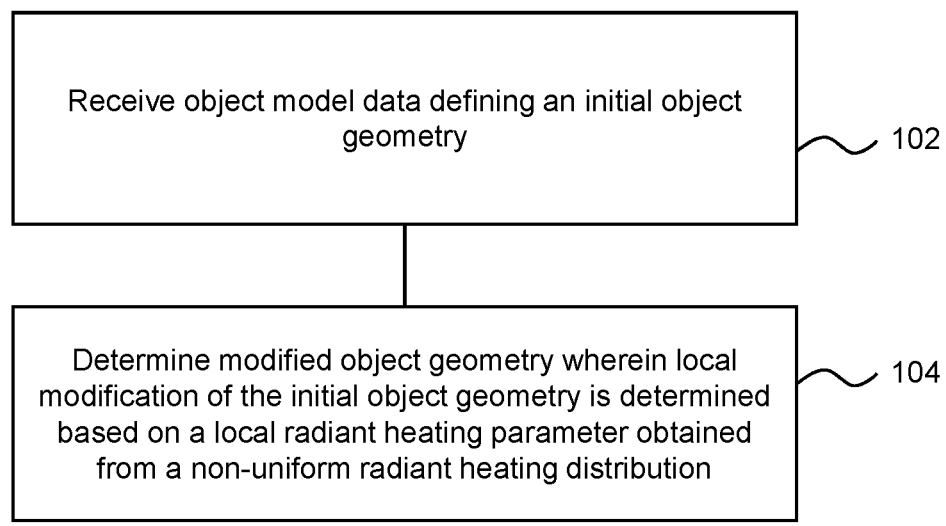
FIG. 1 is a flowchart of an example method of processing data for use in additive manufacturing.

Additive manufacturing techniques may generate a three-dimensional object through the solidification of a build material. In some examples, the build material is a powder-like granular material, which may for example be a plastic, ceramic or metal powder and the properties of generated objects may depend on the type of build material and the type of solidification mechanism used. Build material may be deposited, for example on a print bed and processed layer by layer, for example within a fabrication chamber. According to one example, a suitable build material may be PA12 build material commercially known as V1R10A "HP PA12" available from HP Inc.

In some examples, selective solidification is achieved through directional application of energy, for example using a laser or electron beam which results in solidification of build material where the directional energy is applied. In other examples, at least one print agent may be selectively applied to the build material, and may be liquid when applied. For example, a fusing agent (also termed a 'coalescence agent' or 'coalescing agent') may be selectively distributed onto portions of a layer of build material in a pattern derived from data representing a slice of a three-dimensional object to be generated (which may for example be generated from structural design data). The fusing agent may have a composition which absorbs energy such that, when energy (for example, heat) is applied to the layer, the build material to which fusing agent has been applied heats up/melts, coalesces and upon cooling solidifies to form a slice of the three-dimensional object in accordance with the pattern. In other examples, coalescence may be achieved in some other manner.

In an example, a suitable fusing agent may be an ink-type formulation comprising carbon black, such as, for example, the fusing agent formulation commercially known as V1Q60A "HP fusing agent" available from HP Inc. In some examples, a fusing agent may comprise at least one of an infra-red light absorber, a near infra-red light absorber, a visible light absorber and a UV light absorber. Examples of print agents comprising visible light enhancers are dye based colored ink and pigment based colored ink, such as inks commercially known as CE039A and CE042A available from HP Inc.

In addition to a fusing agent, in some examples, a print agent may comprise a detailing agent, or coalescence modifier agent, which acts to modify the effects of a fusing agent for example by reducing (e.g. by cooling) or increasing coalescence or to assist in producing a particular finish or appearance to an object. Detailing agent may also be used to control thermal aspects of a layer of build material—e.g. to provide cooling. In some examples, detailing agent may be used near edge surfaces of an object being printed. According to one example, a suitable detailing agent may be a formulation commercially known as V1Q61A "HP detailing agent" available from HP Inc. A coloring agent, for example comprising a dye or colorant, may in some examples be used as a fusing agent or a coalescence modifier agent, and/or as a print agent to provide a particular color for the object. Print agents may control or influence other physical or appearance properties, such as strength, resilience, conductivity, transparency, surface texture or the like.

As noted above, additive manufacturing systems may generate objects based on structural design data. This may involve a designer generating a three-dimensional model of an object to be generated, for example using a computer aided design (CAD) application. The model may define the solid portions of the object. To generate a three-dimensional object from the model using an additive manufacturing system, the model data can be processed to generate slices defined between parallel planes of the model. Each slice may define a portion of a respective layer of build material that is to be solidified or caused to coalesce by the additive manufacturing system.

In some examples, it may be intended to manufacture objects to a high dimensional accuracy.

FIG. 1 is an example method, which may comprise a computer implemented method for modifying object model data, comprising, in block 102, receiving object model data representing at least a portion of an object defining an initial object geometry. The object represented by the object model data is to be generated by an additive manufacturing apparatus by fusing build material using a radiant heater. The object model may comprise data representing at least a portion (in some examples, a slice) of an object to be generated by an additive manufacturing apparatus by fusing a build material. The object model data may for example comprise a Computer Aided Design (CAD) model, and/or may for example be a STereoLithographic (STL) data file.

In some examples, the object model data may represent the object or object region as a plurality of sub-volumes, wherein each sub-volume represents a region of the object which is individually addressable in object generation. In some examples herein, the sub-volumes may be referred to as voxels, i.e. three-dimensional pixels, wherein each voxel occupies or represents a discrete volume. In some examples of additive manufacturing, three-dimensional space may be characterised in terms of such voxels. In some examples, the voxels are determined bearing in mind the print resolution of an object generation apparatus, such that each voxel represents a region which may be uniquely addressed when applying print agents, and therefore the properties of one voxel may vary from those of neighbouring voxels. In other words, a voxel may correspond to a volume which can be individually addressed by an object generation apparatus (which may be a particular object generation apparatus, or a class of object generation apparatus, or the like) such that the properties thereof can be determined at least substantially independently of the properties of other voxels. For example, the 'height' of a voxel may correspond to the height of a layer of build material. In some examples, the addressable location resolution of an object generation apparatus may exceed a voxel resolution of an object model. In general, the voxels of an object model may each have the same shape (for example, cuboid or tetrahedral), but they may in principle differ in shape. In some examples, voxels are cuboids, for example based on the height of a layer of build material. In some examples, in processing data representing an object, each voxel may be associated with properties, and/or to object generation instructions, which apply to the voxel as a whole.

Block 104 comprises determining, using at least one processor, a modified object geometry, wherein a local modification of the initial object geometry is determined based on a local radiant heating parameter obtained from a non-uniform radiant heating distribution of the additive manufacturing apparatus. A local modification may be to erode or dilate the initial object geometry (i.e. by reducing or increasing the volume of a local portion of the geometry), with the local erosion or dilation being determined based on the local radiant heating parameter.

In some 3D printing systems, when an object is generated in a process which includes heat, additional build material may unintentionally adhere to the object on generation. To consider a slice or layer of an object, in an example, print agent may be applied (and/or control instructions may be specified) with a resolution of around 600 dpi (dots per inch) or 1200 dpi. In other examples, other resolutions may be used for control instructions and/or print agent application. 600 dpi allows a uniquely addressable region of 42 by 42 microns in cross section, and thus voxels locations may be defined to relate to a 42 by 42 micron region. Print agent may be associated with a group of voxels, which in turn correspond to regions of the layer. However, when fusing agent has been applied and energy is supplied (e.g. by radiant heating), build material of neighbouring regions/voxels may become heated and fuse to the outside of the object (in some examples, being fully or partially melted, or adhering to melted build material as powder). Therefore, a dimension of the object(s) may be larger than the regions to which fusing agent is applied.

Conversely, when insufficient energy is supplied (e.g. by radiant heating) to fuse build material in all addressable locations that are designated for fusing (i.e. correspond to portions of the initial object volume), it may be that an inner region of the object may fuse owing to concentration of heat energy towards an inner portion of an object and an outer region of the object may not fuse as intended. Therefore, a dimension of the object(s) may be smaller than the regions to which fusing agent is applied.

In order to compensate for the fact that objects may tend to 'grow' or 'shrink' during manufacture as described above, the object geometry as described in object model data may be modified, for example by being eroded or dilated (i.e. locally reduced or increased in size). In this way, the object once formed may end up being closer to an intended size. In some examples, the analysis done in block 104 to determine a modified object geometry may be carried out on a slice by slice basis. In some examples, the slice may be a slice of a virtual build geometry modelling an intended 'real' build geometry, and may comprise slices taken from more than one object model. In some examples, the slices may be one voxel thick.

According to the method of FIG. 1, an analysis may be carried out to determine a local radiant heating parameter relating to a non-uniform distribution of radiant heating for an additive manufacturing apparatus, or the local radiant heating parameter may otherwise be obtained, for example, from a non-uniform radiant heating distribution stored in a memory of the additive manufacturing apparatus or remotely. As the amount by which an object grows or shrinks locally may be based on the local temperature (with hotter object portions tending to grow more than cooler object portions, which may shrink), the method proposes basing a local modification of an object geometry on a local radiant heating parameter which relates to the heating distribution of a radiant heater.

Additive manufacturing processes based on the application of radiant heat to a layer of build material may operate based on an assumed distribution of radiant heat, which may be assumed to be a substantially uniform distribution of radiant heat. Actual local temperatures achieved in a layer of build material during object generation may be a function of an amount of fusing agent to be applied to the respective region (which fusing agent may promote transfer of radiant heat energy to the build material); and of heat transfer in lateral directions (X and Y directions) within the layer of build material and vertical directions (Z) between layers of build material. Accordingly, regions where a large object is to be generated or where a relatively large amount of fusing agent is applied may reach higher temperatures so as to fuse, whereas regions of build material remote from objects to be generated may reach relatively lower temperatures, and therefore may not fuse.

A radiant heating distribution of an additive manufacturing apparatus relates to the actual distribution of heat energy over a layer of build material, independent of any selective transfer of that heat (e.g. by a fusing agent) to build agent. In other words, the radiant heating distribution relates to the distribution of heat (energy) from a radiant heater and is independent of a temperature distribution in build material owing to object generation (i.e. owing to the application of fusing agent, the conversion of radiant heat energy to heat in the build material where fusing agent is applied, and heat transfer from adjacent regions of fused build material).

Figure 2A:
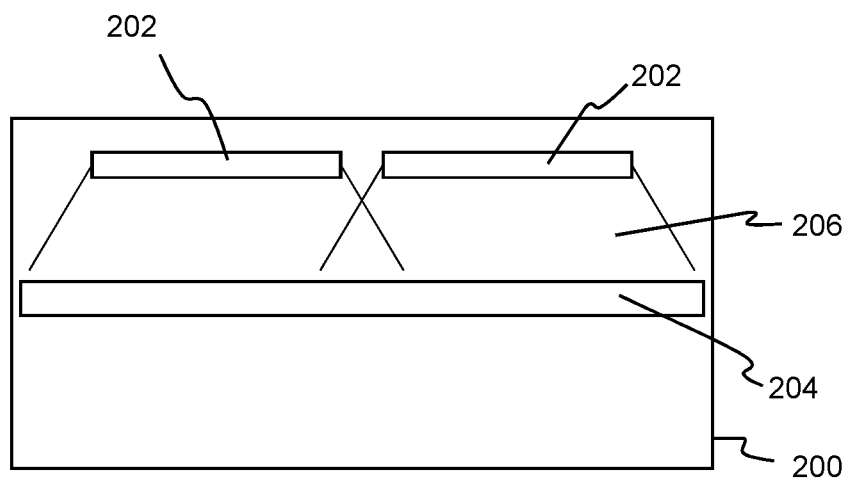
FIGS. 2A, 2B, 2C, 2D show examples of an additive manufacturing apparatus, a 1D plot (2B) and a 2D plot (2C) of a radiant heating distribution of the apparatus, and a cake of build material produced in the additive manufacturing apparatus.

It may be possible to minimise variations in a radiant heating distribution of a radiant heater of an additive manufacturing apparatus so as to provide a substantially uniform radiant heating distribution, such that an actual heating distribution achieved in practice may be close to a baseline heating distribution (such as a uniform heating distribution). However, it may be complex or expensive to provide radiant heaters having such a substantially uniform heating distribution. In practice, hotspots and coolspots may be generated owing to non-uniform dispersion of radiant heat from a heating element of a radiant heater, or from partially-overlapping dispersions from adjacent radiant heaters. Such hotspots and coolspots may translate to an object being generated larger or smaller than intended, dependent on the position of the object in a print bed. An actual heating distribution, as may be measured by determining temperatures of heated build material, may be influenced by non-uniform conductive heat transfer. For example, conductive heat transfer may be greater towards the periphery of a print bed FIG. 2A schematically shows an example additive manufacturing apparatus 200 comprising a radiant heater including two radiant heating elements 202 disposed over a print bed 204 for receiving a layer of build material (such as the calibration layer of FIG. 2D, described below). Each radiant heating element 202 directs radiant heat towards the print bed, each radiant heating element having an element heating distribution 206 of radiant heat energy. In some examples the element heating distribution 206 of a radiant heating element may be substantially uniform, but adjacent heating distributions 206 may overlap to generate hotspots in the region of overlap. In further examples, the element heating distribution 206 of a radiant heating element may be non-uniform that result in hotspots or coolspots on the print bed, and there may or may not be overlap between adjacent heating distributions. In some examples there may be a single radiant heating element, and in others a plurality of radiant heating elements.

Figure 2B:
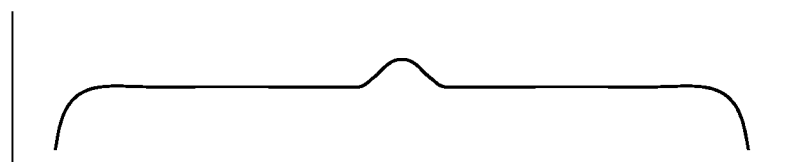

FIG. 2B schematically shows an example plot of radiant heat energy along a lateral line along the print bed 204 of the apparatus 200 of FIG. 2A. The plot shows the amount of radiant heat energy increasing from either edge of the print bed 204 and plateauing away from the edges. In a central region corresponding to a region of overlap between the radiant heating elements 202, there is a local peak in radiant heat energy.

Figure 2C:
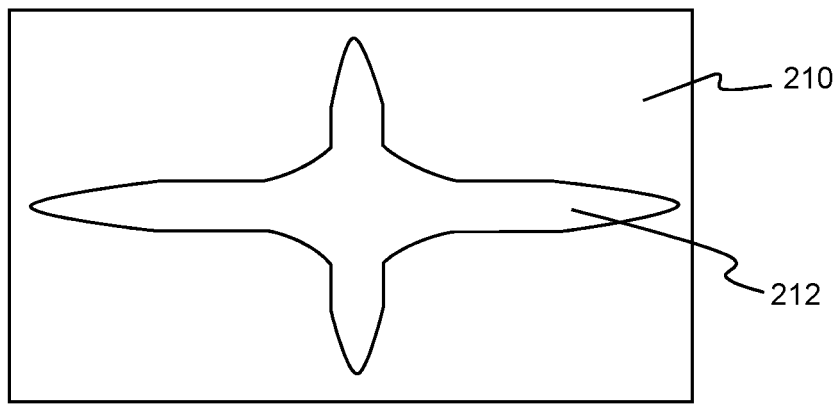

FIG. 2C schematically shows an example contour plot of a hotspot region of radiant heat energy within the radiant heating distribution of the example radiant heater of the additive manufacturing apparatus. The contour plot shows a contour 212 of radiant heat energy above a threshold within a layer 210 of build material (such as a calibration layer as described below). The threshold may correspond to a baseline uniform level of radiant heat for which the radiant heater is rated or designed. In this example, the contour plot relates to a radiant heater comprising four static radiant heating elements with partially-overlapping heating dispersions. In other examples, a radiant heater may have a different configuration. For example, a radiant heater may comprise a linear array of radiant heaters which is mounted to move (i.e. to scan) over a layer of build material received on the print bed.

A radiant heat distribution of the radiant heater may be determined by applying a calibration layer of build material in a build chamber of the additive manufacturing apparatus (i.e. onto a print bed), heating the calibration layer of build material using the radiant heater; and determining a non-uniform radiant heating distribution based on monitoring a temperature distribution of the heated build material using a temperature sensor. For example, a radiant heater may be rated to heat a freshly-applied calibration layer of build material (in the absence of a fusing agent) to a target temperature (for example 150°). Such heating may be achieved by a radiant heater which comprises a plurality of heater modules, each of which may comprise a plurality of heater elements. For example, a radiant heater may comprise a first heater module to heat the build material of a print bed in a first mode, and a second heater module to heat build material of the print bed in a second mode. For example, the first heater module may be controlled to heat the build material to a first threshold temperature below a fusing threshold temperature, and the second heater module may be controlled to further heat the print bed such that the uppermost layer of build material is selectively fused (e.g. where fusing agent is applied). Accordingly, in the absence of fusing agent applied to an uppermost layer of build material, the second heater module may be controlled to further heat regions of the uppermost layer of build material to a second threshold temperature below the fusing temperature, which may be a baseline temperature for which the radiant heater as a whole is rated. In some examples, the first heater module and the second heater module may be operated for different durations or at different heating powers. For example, the first heater module may be operated for a relatively longer period during each layer cycle (i.e. a cycle of applying a layer of build material and heating it) or continuously, whereas the second heater module may be operated for a relatively shorter period during each layer cycle. The first heater module may be a static heater module which is to distribute heat over substantially the entire print bed without moving relative the print bed, whereas the second heater module may be a scanning heater which is to move over the print bed. A radiant heat distribution of a radiant heater comprising such a plurality of heater modules relates to the radiant heat distribution of the compound heating effect of the two radiant heater modules. The temperature sensor may evaluate an actual distribution of temperature over the calibration layer, which may include regions varying from a baseline temperature, for example including hotspots and coolspots. The temperature sensor may be a remote-sensing thermometer, such as a pyrometer.

The calibration layer of build material may be applied, and the radiant heating distribution of an additive manufacturing apparatus may be determined during commissioning of an additive manufacturing apparatus (i.e. initial set-up); during periodic servicing; or at regular intervals including before selected or each additive manufacturing process to be run using the additive manufacturing apparatus to generate an object.

A radiant heating distribution may be specific to an additive manufacturing apparatus. In some examples, a radiant heating distribution may be obtained for a model or variant assembly of an additive manufacturing apparatus having multiple like instances (i.e. multiple manufactured products) and may be stored in or obtainable by the respective additive manufacturing apparatus or remotely from the additive manufacturing apparatus in order to determine a modification of object model data as described herein. In other examples, a radiant heating distribution may be determined for a specific (i.e. a unique) additive manufacturing apparatus.

Figure 2D:
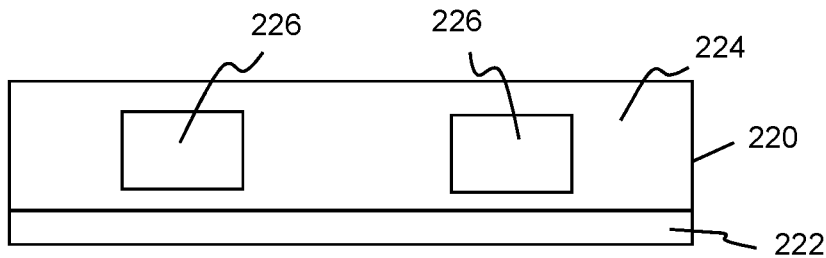

The application of successive layers of build material in an additive manufacturing process generates a cake of build material, with selected regions of selected layers of the build material being fused to form an object therein. Where the calibration layer is applied before or during an additive manufacturing process such that it constitutes part of the cake, the calibration layer of build material may be applied in a calibration region of the cake. In particular, the layers of build material may be applied and heated so that the cake comprises an unfused calibration region comprising the calibration layer, and which is substantially free of fused build material; and an object region comprising an object layer comprising fused build material corresponding to a portion of the object. FIG. 2D schematically illustrates such a cake 220 comprising a calibration region 222 corresponding to a plurality of successive unfused layers of build material (including a calibration layer as described above) at a lower portion of the cake, and an object region 224 above the calibration region and comprising an object 226 generated by fusing successive layers of build material. In the example cake 220 of FIG. 2D, there are two such fused objects. The calibration layer may be applied without application of a fusing agent which may promote transfer of radiant heat to build material to cause fusing.

In some examples, a local modification of the initial object geometry may be determined based on a local radiant heating parameter obtained from a non-uniform heating distribution determined as described above. Object model data may be modified to erode or dilate a surface of an object represented by the object model data by removing or adding a number of voxels at the surface in dependence on a local heating parameter obtained from the non-uniform heating distribution. The number of voxels (which may be one) to be eroded or added may depend on the local heating parameter, which may reflect the severity of a hot spot or a cool spot.

In some examples, different erosion or dilation algorithms may be provided for object modification in the XY plane (i.e. in the plane of application of a layer of build material) as for object modification in the Z direction (i.e. the height direction of a cake of build material).

In some examples, the radiant heating distribution may be stored such that a local heating parameter indicative is stored to indicate the presence or severity of a local hotspot or coolspot, for example in a memory of the additive manufacturing apparatus or remotely from the additive manufacturing apparatus. For example, local heating parameters may be stored in a look-up table for XY locations within a layer of build material. The local heating parameters may be stored, for example, as a temperature offset of the build material from a baseline, or as a number of voxels to be eroded or added in an erosion or dilation operation. In some examples, the radiant heating distribution may be stored as an image, which may be a compressed image (such as JPEG, with different shades or colours representing hotspots or coolspots of varying gradations of severity).

FIG. 3 is a flowchart of a further example method in which object model data defining an initial object geometry is modified based on a non-uniform radiant heating distribution of an additive manufacturing apparatus. In this example, the initial object geometry is modified based on both a predicted temperature of object generation (i.e. owing to fusing of selectively-heated build material and heat transfer between regions of selectively-heated build material) and a radiant heating distribution of the additive manufacturing apparatus as described above. In this example, both factors are taken into account by modifying the predicted temperature of build material owing to object generation (i.e. owing to fusing of build material and heat transfer between regions of build material) to additionally take into account a radiant heating distribution determined for the additive manufacturing apparatus.

In some examples, determining the predicted temperature values of object generation may comprise determining a model of a heat map for at least a portion of the object during object generation. This may be based on an intended distribution of print agents, a choice of intended print agent(s) and/or intended operational temperatures (such as bed warming temperatures) and the like.

In block 302, object model data representing at least a portion of an object defining an initial object geometry is received. Block 304 comprises analysing the object model data representing at least a portion of the object defining an initial object geometry to determine a plurality of predicted temperatures of object generation, each predicted temperature corresponding to a different location (in the object or a layer(s) of build material in which the object is to be generated). The predicted temperature may be a peak temperature of object generation, i.e. a maximum temperature experienced during heating of a layer of build material, such that the predicted temperature may be used for determinations as to whether or not fusing occurs. The method may additionally comprise determining object generation instructions for generating the object. The object generation instructions may specify an amount of print agent to be applied to each of a plurality of locations on a layer of build material. The method may additional comprise generating an object based on the object generation instructions.

In this example, the predicted temperatures of object generation are determined at least in part based on the non-uniform radiant heat distribution determined for the radiant heater of the additive heating manufacturing apparatus. For example, the radiant heating temperature distribution may be determined as a temperature offset or delta to be applied to initial predicted temperatures.

As the amount by which an object grows or shrinks locally may be based on the local temperature (with hotter object portions tending to grow more than cooler object portions, which may shrink), the method proposes basing a local modification of an object geometry on a locally predicted temperature.

The temperatures achieved in object generation may be associated with the solid volume of object features, and also the proximity of object features to other object features. In addition, the temperature achieved may be affected by at least one print agent (including the choice and/or amount of such print agent) applied to the build material. Growth of an object can be caused or enhanced by large thermal masses, or by the close proximity of smaller parts that act like a larger consolidated thermal mass.

In some examples, sub-volumes may be removed (or eroded) in at least one object model sub-volume to prevent different object surfaces from fusing together, or to ensure intended cavities remain open.

In some examples, a number of sub-volumes/voxels 'behind' a surface sub-volume/voxel may be selected for removal in a dimension which is orthogonal to the surface of the object at that surface voxel based on the temperature of the surface voxel. The temperature of the voxel may be an average temperature, for example corresponding to the temperature of a pixel of a heat map (which may correspond to a voxel on a many to one, one to one, or one to many basis), or may be a temperature predicted for a point within the voxel, or determined in some other way. For example, an object perimeter may be divided into lengths, and the average temperature of each length (in some examples, to a threshold depth) may provide a local temperature based on which a local modification of object geometry, such as a local increase or reduction in volume may be determined. In some examples, the perimeter may be divided into predicted temperature 'bins' based on a predicted temperature falling within a temperature range, and this may define a local region to which a determined reduction may be applied. In some examples, an increase or reduction in object geometry volume (i.e. erosion) proximate a first location of the object (which may be a surface location) is based on a first predicted object generation temperature and an increase or reduction in object geometry volume (i.e. erosion) proximate a second location is based on a second predicted object generation temperature.

A temperature for a voxel (or more generally for a pixel of a heat map) may be predicted based on an amount of fusing agent to be applied to a region of the build material corresponding to the voxel/pixel, and based on the predicted temperature of surrounding voxels/pixels, from and to which heat may diffuse. In some examples, a heat model is determined at a resolution of 600 dpi, and a heat value of between 0-255 is associated with the pixels of such a heat map, where 0 represents the lowest anticipated temperature of the layer in object generation and 255 represents the highest anticipated temperature in object generation.

FIG. 4A shows an example of a slice of an object model 400, in this case having a first, narrow, portion 402 and a second, wider, portion 404. In generating an object according to the model, the wider portion 404 of the layer may be expected to become hotter as there will be generally more fusing agent applied, which becomes hotter than untreated build material, in that portion 404. A modified object geometry perimeter 406 is shown as a dotted line. The dotted line is closer to the edges of the narrow portion 402 than to the edges of the wider portion 404. In other words, a local reduction in volume is associated with a local temperature, and higher local temperatures may in some examples, or in general, result in a greater reduction in volume.

FIG. 4B shows an example of a section 408 of the object slice 400 of FIG. 4A shown as a 'voxelised' representation, represented in cross sections as squares (but in reality would have a slice height). The voxels may represent 42 micron cubes. Here it may be seen that the modified object parameter follows the voxelised structure, such that whole voxels are 'eroded' from the original object geometry to produce a modified object geometry. More voxels are outside the perimeter 406 in the wider portion 404 than in the narrow portion 402—in this example, four voxels are to be eroded from the wider portion and two voxels are to be eroded in the narrow portion 402. In other words, in this example, the 'erosions' are voxelwise, or 'sub-volumewise' erosions.

In other examples, the object model may be eroded according to a reduction of local volume (or dilated according to an increase) on a substantially continuous scale, rather than in terms of voxels. In some such examples, the model may be 'voxelised', i.e. separated into subvolumes, subsequently.

In some examples, the voxels may be a consistent size. In other examples, the voxels may vary in size. In some example, voxels to a first depth below the surface may have a first, finer or higher, resolution (i.e. have a first, smaller, size) and voxels below the first depth may have second, lower or coarser resolution (i.e. have a second, larger, size). This may allow a greater resolution in modifying the object geometry. The first depth may be consistent for an object or a slice, for example based on a thermal mass of the object/object slice. In other examples, the first depth may vary, for example based on a local temperature, according to the techniques set out herein in relation to object geometry modification (i.e. local volume reduction or increase).

Figure 5:
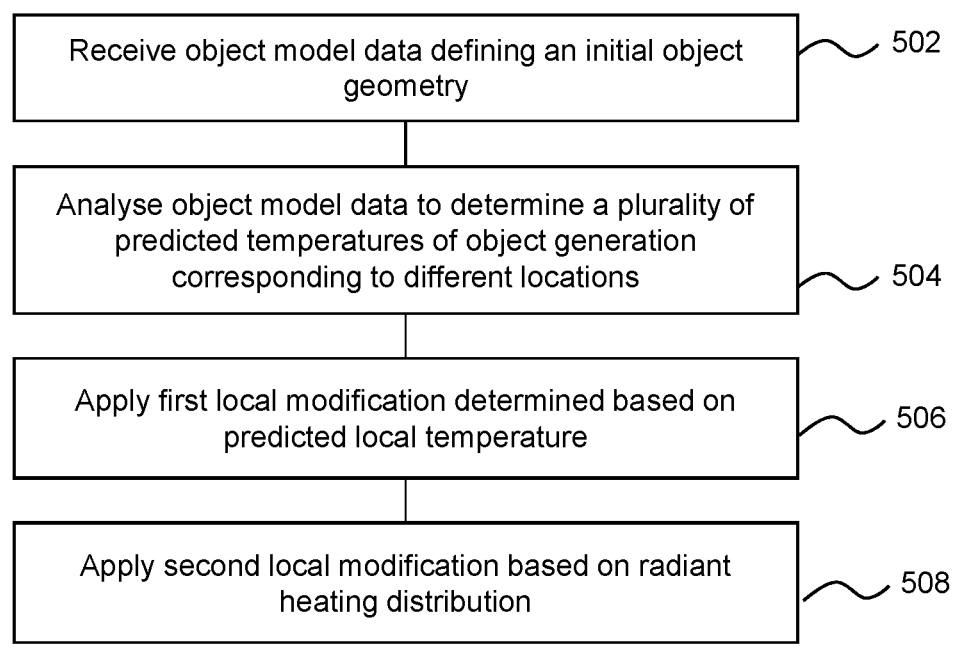
FIG. 5 is a flowchart of an example method of processing data for use in additive manufacturing.

FIG. 5 is a flowchart of a further example method in which object model data defining an initial object geometry is modified based on a non-uniform radiant heating distribution of an additive manufacturing apparatus. In this example, the initial object geometry is modified based on both a predicted temperature of object generation (i.e. owing to fusing of selectively-heated build material and heat transfer between regions of selectively-heated build material) and a radiant heating distribution of the additive manufacturing apparatus as described above. In this example, both factors are taken into account by applying a modification of the object model data based on predicting the local temperature of build material owing to object generation (i.e. owing to fusing of build material and heat transfer between regions of fused build material, independently of any non-uniformity in a radiant heat distribution of the additive manufacturing apparatus) and separately applying a modification of the object model data based on the radiant heating distribution determined for the additive manufacturing apparatus.

In block 502, object model data representing at least a portion of an object defining an initial object geometry is received. Block 504 comprises analysing the object model data representing at least a portion of the object defining an initial object geometry to determine a plurality of predicted temperatures of object generation, each predicted temperature corresponding to a different location (in the object or a layer(s) of build material in which the object is to be generated).

The temperatures of object generation are determined as described above, except for that in this example, the predicted temperatures of object generation are determined independently of any non-uniformity in a radiant heating distribution of the additive manufacturing apparatus.

Block 506 comprises applying to the initial object geometry a first local modification determined based on a predicted local temperature of object generation. For example, the modification may be applied as a number of voxels to erode or add to a local surface of an object represented by the object model data.

Block 508 comprises applying to the initial object geometry a second local modification determined based on a local radiant heating parameter obtained from a non-uniform radiant heating distribution of the additive manufacturing apparatus (which may be obtained as described above). For example, the modification may be applied as a number of voxels to erode or add to a local surface of an object represented by the object model data.

The first and second modifications may be applied individually in any order, or the modifications can be added together and applied together. The first and second modifications may each be applied separately in the XY plane and the Z plane, for example by applying different modification algorithms to the object model data to erode or dilate an object represented by the object model data.

The first local modification determined based on a predicted local temperature may be applied separately from the second local modification determined based on the local radiant heating parameter obtained from the non-uniform radiant heating distribution of the additive manufacturing apparatus. For example, the first and second modifications may be applied sequentially. Modifications of the first type may be applied throughout the object model data (where appropriate), and subsequently modifications of the second type may be applied throughout the object model data.

The method may additionally comprise determining object generation instructions for generating the object. The object generation instructions may specify an amount of print agent to be applied to each of a plurality of locations on a layer of build material. The method may additional comprise generating an object based on the object generation instructions.

Figure 6:
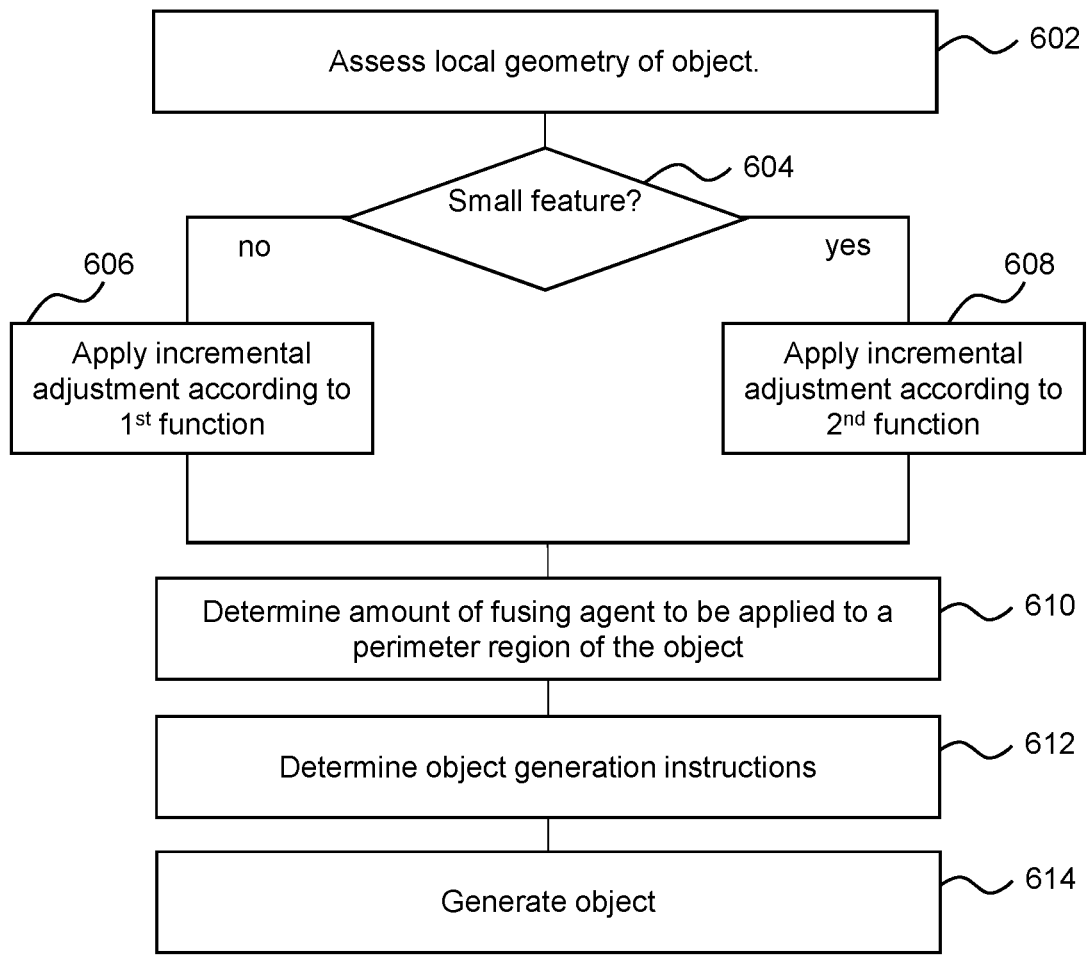
FIG. 6 is a flowchart of an example method of generating an object using additive manufacturing.

FIG. 6 is another example of method, which may be, at least in part, a computer implemented method. Block 602 comprises assessing a local geometry of an object. For example, this may be in order to identify small features. In one example, identifying small features may comprise applying a transformation that returns a metric that correlates with the radius of the feature. This value may then be categorised as a size value, which may for example be an 8-bit value between 0 and 255 and used to create a mask that may be applied by a logical AND operation to an object geometry (for example, a slice of an object) to identify the areas categorised as small features. Small features may be those having dimensions of around 0.04 mm (which corresponds to a single voxel location at 600 dpi) to around 3 mm.

Another method of identifying a small feature may comprise reducing (eroding) an initial object geometry by a threshold amount (e.g. 0.04 mm-3 mm) in at least one spatial dimension to provide an eroded object geometry, then increasing the eroded object geometry in the at least one spatial dimension by the threshold amount to provide a dilated object geometry, and comparing the dilated object geometry to the initial object geometry. Where there is a difference, this indicates that a feature was fully eroded, and therefore may comprise a small feature.

If it is determined, in block 604, that the local geometry does not comprise a small geometric feature, then the method proceeds to block 606. If however the local geometry comprises a small geometric feature, the method proceeds to block 608. Blocks 606 and 608 comprise applying an incremental adjustment to the object geometry (e.g., eroding or adding at least one sub-volume or voxel) according to, respectively, a first and a second function. The extent of the erosion or dilation may be determined in accordance with any of the methods described herein, i.e. based on a non-uniform radiant heating distribution (method of FIG. 1), a compound erosion or dilation based on a predicted temperature of object generation taking into account a non-uniform radiant heating distribution (method of FIG. 3), or based on a predicted temperature of object generation and separately based on a non-uniform radiant heating distribution (method of FIG. 4). The first and second functions may be different from one another. In some examples, at least one or both of the first and second functions are staircase functions, i.e. increase and/or decrease abruptly from one constant value to another. In other words, a first range of temperatures will be associated with a first number of sub-volumes or voxels being eroded whereas a second range of temperatures will be associated with a second number of sub-volumes or voxels being eroded. This is set out in greater detail below with reference to FIGS. 7A-7D.

Block 610 comprises determining an amount of fusing agent to be applied to a perimeter region of the object. For example, this may comprise determining an amount of fusing agent to be applied to a region corresponding to a surface voxel of the modified object geometry. The amount of fusing agent is based on a local temperature. In examples where the first and second functions are staircase functions, and each incremental adjustment is associated with the predicted temperature range, for at least one predicted temperature range the amount of fusing agent to be applied is higher when the local temperature is at a low end of the temperature range and lower when the local temperature is at a higher end of the temperature range. Again, this is set out in greater detail below with reference to FIGS. 7A-7D.

Block 612 comprises determining object generation instructions for generating the object, the object generation instructions specifying an amount of print agent to be applied to each of a plurality of locations (including the object perimeter region) on a layer of build material.

Block 614 comprises generating an object based on the object generation instructions. For example, the object may be generated in a layer-wise manner, with successive layers of build material being formed and print agent selectively applied thereto. Energy (for example, heat) may be applied to the layers to cause selective melting and coalescence of the build material.

Figure 7A:
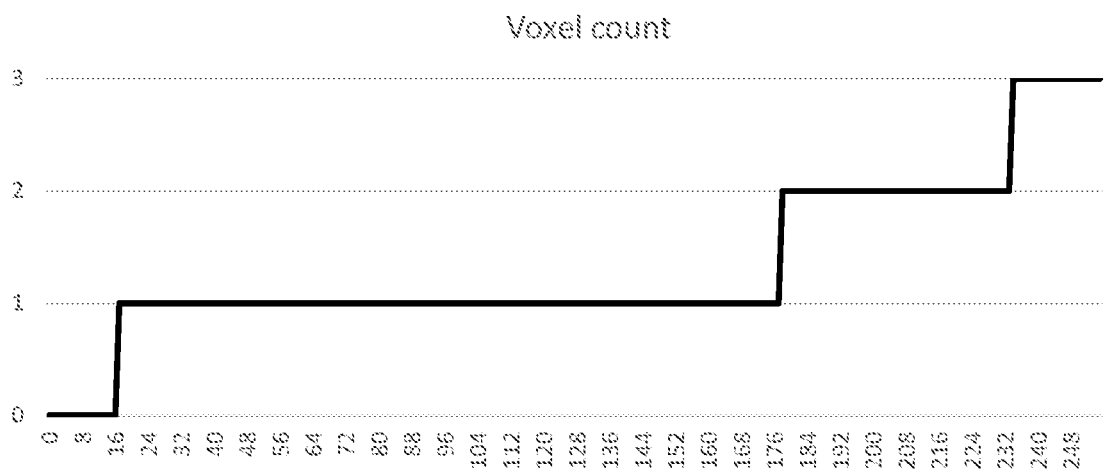
FIGS. 7A-D show examples of functions for use in determining a voxel erosion magnitude and/or a contone level for fusing agent to be applied in object generation.

FIG. 7A shows an example of a first staircase function with heat values shown on the x-axis and a number of voxels to remove from an object geometry shown on the y-axis. In this example, the heat values are encoded as 8 bit values (i.e. having a value of between 0 and 255, where 0 may correspond to the base temperature of untreated build material (i.e. build material which is not intended to fuse, but which may experience some preheating). In some examples, for a build material referred to as PA12, the melting temperature is around 188-190° C. and the operation temperatures may be a minimum of around 162-168° C., but these temperatures may vary based on the materials and the like.

In this example, the staircase function is 0 until a value of 17 is reached. Then a single voxel is indicated for heat values between 17 and 177. Two voxels are indicated for heat values between 178 and 233 and three voxels are indicated for higher heat values. As explained in greater detail below, in some examples, there is a minimum erosion of 1 voxel and/or the number of voxels to be eroded is the number specified by the staircase function "+1".

In some examples, this staircase function may be used to define an 'erosion mask', for example based on the following transform, which could be applied to a slice of the object model which defines an XY plane:

Threshold($XY$ distance plane, erosion pixels, 255, 0)
    =erosion mask

The output of this transform is 255 where an XY distance from the surface of the object (which may be the distance from a perimeter of a slice of the object) is greater than the number of voxels to be eroded and 0 elsewhere. In some examples, a 'strict compare' may be used. This means that the number of voxels which are actually eroded will be equal to the defined erosion value of the staircase function plus one. However, in other examples, this may not be the case and the staircase function may be defined taking this into account.

This erosion mask may be stored in a mask plane such that it can be applied to a rendered cross-section of the object using a logical AND operation:

AND (object model, erosion mask)=eroded object model

This may result in an object geometry being eroded as a function of the local temperatures (e.g. using a heat map).

In addition, in some examples the amount of fusing agent used in a perimeter region may be controlled based on the position of a heat value within the 'stair' of the staircase function.

Figure 7B:
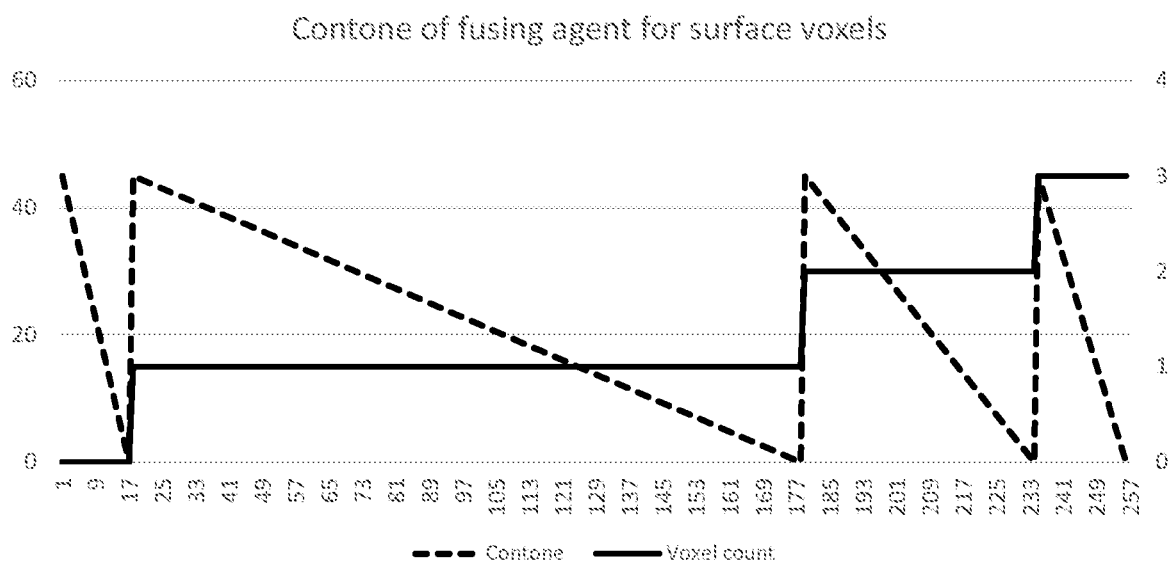

FIG. 7B shows the staircase function of FIG. 7A with an overlaid 'contone' level for the voxels, with the contone scale shown on the left of the Figure. As can be seen, at the left-hand edge of each stair, the contone level is high, indicating a relatively large amount of fusing agent is to be applied. However, at the right-hand edge of each stair, the contone level is low, indicating that a small amount of fusing agent (or no fusing agent for a contone level of 0) is to be applied. This will assist in smoothing the transitions. In this example, the contone level is specified using an 8 bit scale from 0 to 255. Therefore, for examples a contone level of 0 means no fusing agent is applied and 40/255 means that fusing agent is applied at 15% of the maximum fusing agent which may be delivered by that particular object generation apparatus.

Controlling the amount of fusing agent in the external perimeter may assist in providing smooth transitions between layers and between different incremental adjustments.

As noted above, in some examples a different function may be employed in the vicinity, or locality, of small features. Considering the case of such features (e.g. small projections from the surface of an object), and in particular the case of small features which are present in a region of the object where a high amount of heat is expected (for example, small features in an internal cavity of an object, or close proximity to a bulk region), the high heat may suggest that a high number of voxels should be eroded. However, for small features, this may result in an unacceptable reduction in their size, either obliterating the feature or rendering it too small to fuse or too delicate to survive cleaning operations. For example, if a feature has a dimension of around 0.5 mm, this may correspond to 12 voxels at 600 dpi. If three or four voxels are eroded from the side of such a small feature, it will lose approximately 50 to 60% of its cross-section, reducing its size to less than 0.3 mm. Such a feature may be too small to survive cleaning operations.

Figure 7C:
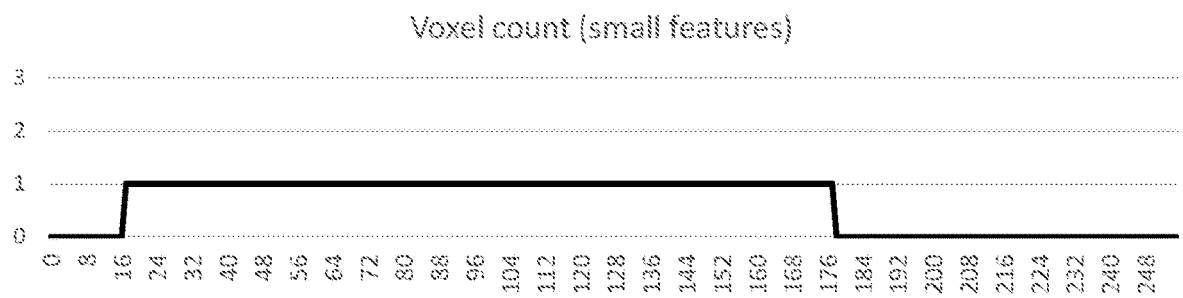

Thus, if a small feature is identified for example as described above in relation to blocks 602 and 604, a different staircase function may be applied, for example being more conservative in terms of the number of voxels eroded (or more generally, in relation to a local reduction in volume) such as the function shown in FIG. 7C.

In this example, the staircase function is zero between 0 and 17, one between 17 and 177 and zero thereafter. The very hot voxels (i.e. those of 177 and above) are not eroded in this example as a design choice. Small features which are, for example, inside a cavity, may reach such temperatures, whereas other small feature surface voxels may be unlikely to reach such high temperatures. In this example, the decision has been taken to preserve the presence of such features at the possible expense of dimensional accuracy. This also promotes the erosion of the larger portion of the object rather than the smaller portion. For example, the cavity may become larger as a result of voxel erosion and the temperature there in may be reduced in that way. Therefore, this staircase function reflects that it is likely that a small feature which becomes very hot (greater than 177 in this example, although other thresholds may be selected in other examples) is likely to be inside a cavity according to predetermined operational parameters. However, other design choices may be made in other examples.

Figure 7D:
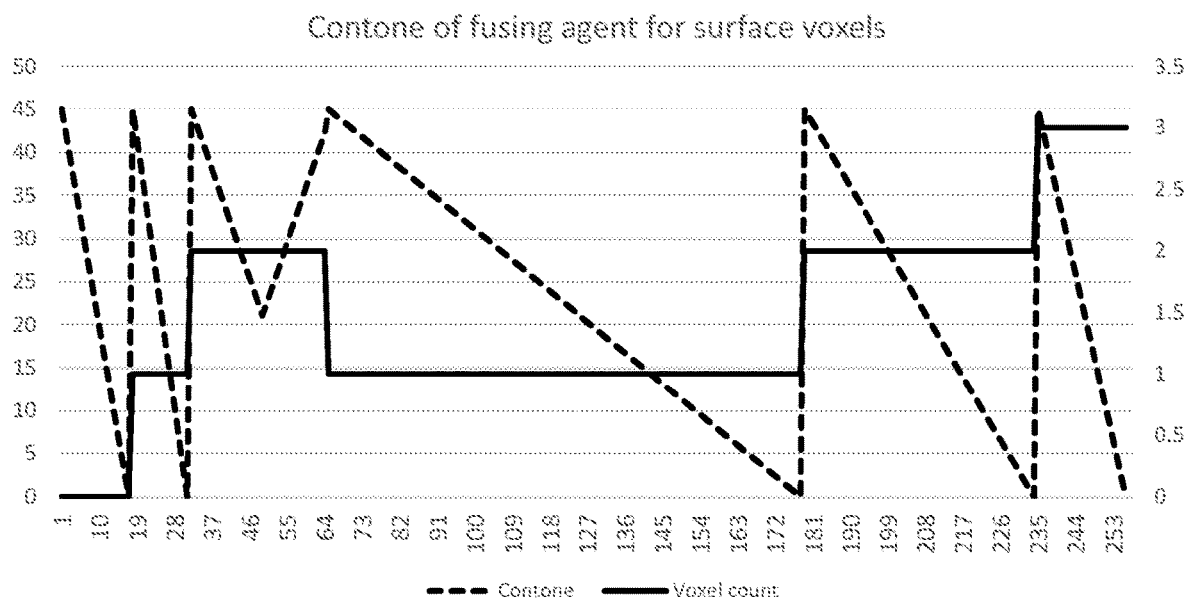

In some cases, the 'small feature', erosion may be added to an originally eroded shape via a logical OR operation:

OR (eroded object model, eroded small features)=Eroded shape with preserved features FIG. 7D shows an alternative staircase function to that shown in FIGS. 7A and 7B, with an overlaid contone level for perimeter voxels. The staircase function is similar to that shown in FIGS. 7A and 7B but there is a region, between 33 and 65 on the heat value scale, in which the number of voxels eroded increases from 1 to 2 voxels. This provides an example of another design choice: in some examples, heat values in this region may be associated with relatively small features, for example features of around 1 mm. These features in turn may be associated with a generally higher contone level of fusing agent to ensure that fusing takes place. This will in turn result in additional heat, which may exceed that in a predictive heat map. Therefore, this particular staircase function anticipates that effect and suggests, for voxels which are likely to be subject to such a high contone specification, an increased erosion. However, this need not be the case in all examples. As may be noted, in FIG. 7D the contone level to be applied to the perimeter voxels reflects this difference with the 'platform' being associated generally with a relatively high contone level and with a ramped function to ensure smoothing at both the staircase edges of the platform between 33 and 65.

In general, as exemplified by FIGS. 7A-D, functions may be designed which incorporate design choices, which may be influenced by the type of apparatus used, operational parameter and/or user priorities. Such functions may result in an erosion size increasing with local temperature, but this need not be the case in all examples, as shown in FIGS. 7C and 7D. While staircase functions have been shown in these examples, in other examples, smoothly varying functions and/or a combination of smoothly varying and stepwise functions may be used in other examples (for example, those which are not associated with 'voxelwise' erosions).

Figure 8:
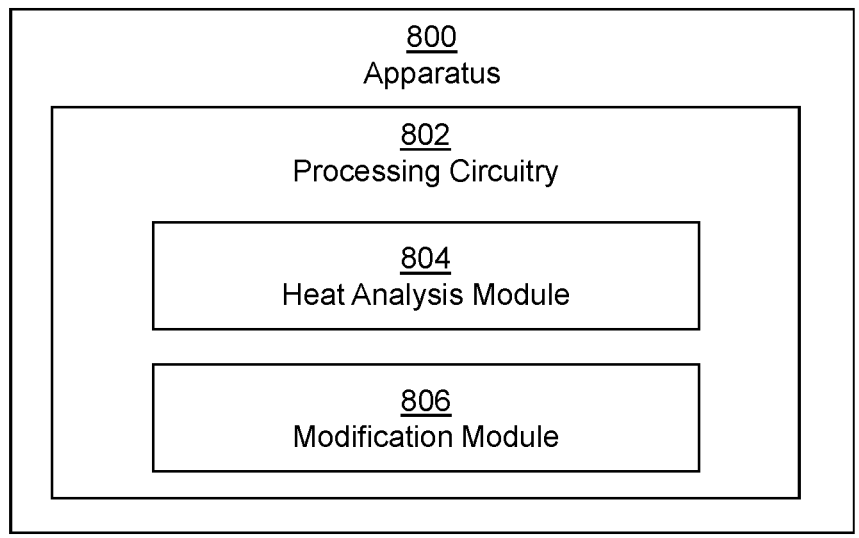
FIGS. 8 and 9 are simplified schematic drawings of example apparatus for additive manufacturing.

FIG. 8 shows an apparatus 800 comprising processing circuitry 802. The processing circuitry 802 comprises a heat analysis module 804 and a modification module 806.

The heat analysis module 804 comprises a hotspot analysis module which, in use of the apparatus 800, obtains a non-uniform radiant heating distribution of an additive manufacturing apparatus.

The modification module 806, in use of the apparatus 800, receives object model data representing a portion of an object having an object geometry to be generated by the additive manufacturing apparatus. The modification module 806, in use of the apparatus 800, further determines modification data, wherein the modification data is indicative of a modification of the object geometry defined by the object model data. A magnitude of a local modification in volume is based on a local radiant heating parameter obtained from the non-uniform radiant heating distribution. The modification may be an increase (dilation) or reduction (erosion) of an initial object geometry.

In some examples, the heat analysis module 804 is to analyse object model data to generate a temperature distribution model (e.g. a heat map) indicative of a predicted temperature distribution within the object during object generation. As described above, in some examples, this may be carried out on a slice by slice basis. The predicted temperature distribution may take into account the non-uniform radiant heating distribution. The modification data may be to modify the volume of the object model, such that a magnitude of a local modification in volume is based on a region of the predicted temperature distribution local to the local modification.

In other examples, the heat analysis module may be to analyse object model data to generate a temperature distribution model (e.g. a heat map) indicative of a predicted temperature distribution within the object during object generation and which is independently of any non-uniformity in a radiant heating distribution. Modification data may include separate modifications of the object geometry of the object model, including a first modification based on the predicted temperature of object generation, and a second modification based on the non-uniform radiant heating distribution.

In some examples, the object model data represents an object as a plurality of predefined sub-volumes (voxels) and the modifications of object geometry are local sub-volume wise reductions or increases in volume.

In some examples, the modification module 806 may remove or erode at least one object model sub-volume to prevent different object surfaces from fusing together and/or such that the object, when generated, has an intended size rather than an enlarged size due to additional build material adhering/fusing to the surfaces thereof.

Figure 9:
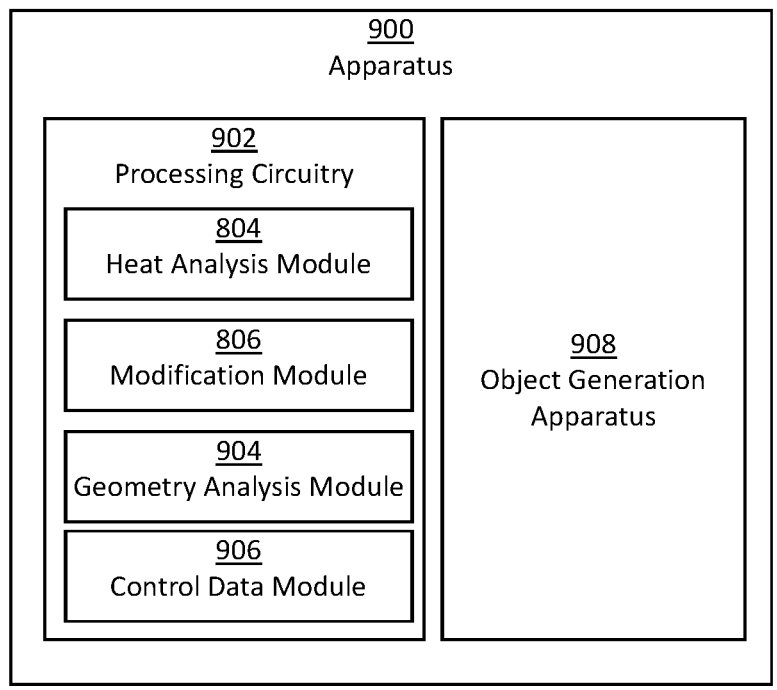

FIG. 9 shows an apparatus 900 comprising processing circuitry 902. The processing circuitry 902 comprises a heat analysis module 804 and a modification module 806 as described above in relation to FIG. 8.

In this example the processing circuitry 902 further comprises a geometry analysis module 904 and a control data module 906, and the apparatus 900 further comprises object generation apparatus 908.

In use of the apparatus 900, the geometry analysis module 904 identifies object features of less than a threshold size. For example, as described above, the size of a geometry modification such as a local volume reduction may tend to be less in the vicinity of smaller features (or in other words, the volume reduction to be applied to an object feature which has been identified as a small feature may tend to be less) than in the region of larger features. In other words, a local reduction of the object volume may be smaller in the vicinity of a small geometric feature of the object than in the region of a larger geometric feature for at least one predicted temperature range.

In use of the apparatus 900, the control data module 906 generates control data to generate each of a plurality of layers of the object. This may for example comprise specifying area coverage(s) for print agents such as fusing agents, colorants, detailing agents and the like. In some examples, object generation parameters are associated with the object model sub-volumes. In some examples, other parameters, such as any, or any combination of heating temperatures, build material choices, a number of printing passes, an intent of the print mode, and the like, may be specified. Such parameters may be used to design or select an erosion function such as a function shown in FIG. 7A-D. In some examples, halftoning may be applied to determined object generation parameters to determine where to place fusing agent or the like. The control data may be specified in association with sub-volumes.

In some examples, the control data comprises a print agent amount associated with sub-volumes. A magnitude of a modification may be associated with a predicted temperature range (i.e. using a staircase function as described above). In some examples, for at least one predicted temperature range, the amount of fusing agent to be applied to a sub-volume (which in some examples may be a sub-volume which is on a perimeter/surface of the object) is higher when the local temperature is at the lower end of the temperature range and lower when the local temperature is at the higher end of the temperature range.

The object generation apparatus 908, in use of the apparatus 900, generates the object in a plurality of layers (which may correspond to respective slices of a virtual build geometry) according to the generated control data. The object generation apparatus 908 may for example generate an object in a layer-wise manner by selectively solidifying portions of layers of build materials. The selective solidification may in some examples be achieved by selectively applying print agents, for example through use of 'inkjet' liquid distribution technologies, and applying energy, for example heat, to the layer. The object generation apparatus 908 may comprise additional components not shown herein, for example any or any combination of a fabrication chamber, a print bed, print head(s) for distributing print agents, a build material distribution system for providing layers of build material, energy sources such as heat lamps and the like, which are not described in detail herein.

The processing circuitry 802, 902 or the modules thereof may carry out any of the blocks of FIG. 1, 3, 5, or 6.

Figure 10:
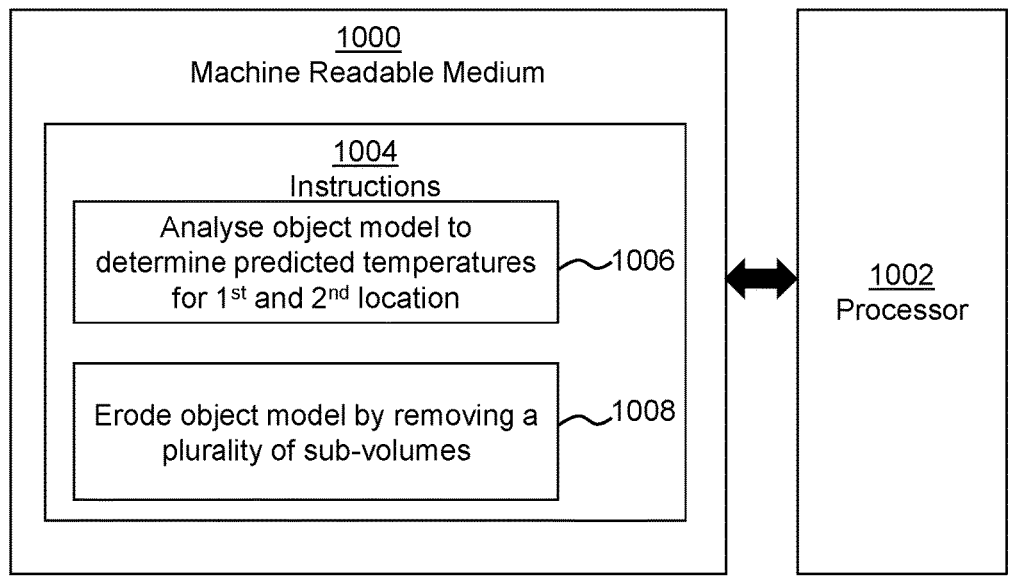
FIG. 10 is a simplified schematic drawing of an example machine readable medium associated with a processor.

FIG. 10 shows a machine readable medium 1000 associated with a processor 1002. The machine readable medium 1000 comprises instructions 1004 which, when executed by the processor 1002, cause the processor 1002 to carry out processes. The instructions 1004 comprise instructions 1006 to cause the processor 1002 to receive object model data representing a portion of an object to be generated by an additive manufacturing apparatus using a radiant heater. The instructions further comprise instructions to cause the processor to determine a first local radiant heating parameter from a non-uniform radiant heating distribution of the additive manufacturing apparatus for a first location in a fabrication chamber, and to determine a second local radiant heating parameter from the non-uniform radiant heating distribution for a second location in the fabrication chamber. The instructions 1004 further comprise instructions to cause the processor 1002 to erode or dilate the object model by removing or adding a plurality of sub-volumes of a predetermined size from or to at least one outer surface of the object model, wherein a number of sub-volumes eroded or added proximate the first location in a fabrication chamber is based on the first local radiant heating parameter and a number of sub-volumes eroded or added proximate the second location is based on the second local radiant heating parameter.

In some examples, the instructions 1004 comprise instructions to analyse the object model (e.g. object model data) to determine a first predicted object generation temperature for a first location in a fabrication chamber and second predicted object generation temperature for a second location in a build chamber (or "fabrication chamber"). In such examples, the first predicted object generation temperature may be determined in part based on the first local radiant heating parameter and the second predicted object generation temperature may be determined in part based on the second local radiant heating parameter. The numbers of sub-volumes to erode or add proximate the first location and the second location respectively may be determined as a function of the respective first and second local radiant heating parameters obtained from teh non-uniform radiant heating distribution, and may be independent of any predicted temperature distribution in build material owing to object generation.

In some examples, the instructions 1004 further comprise instructions to determine a size of object features, wherein the number of sub-volumes eroded varies based on a local predicted object temperature value and the size.

In examples, the machine readable medium 1000 may comprise instructions to carry out any, or any combination, of the blocks of FIG. 1, 3, 5 or 6 or to act as part of the processing circuitry 802, 902 of FIG. 8 or 9.

Figure 11:
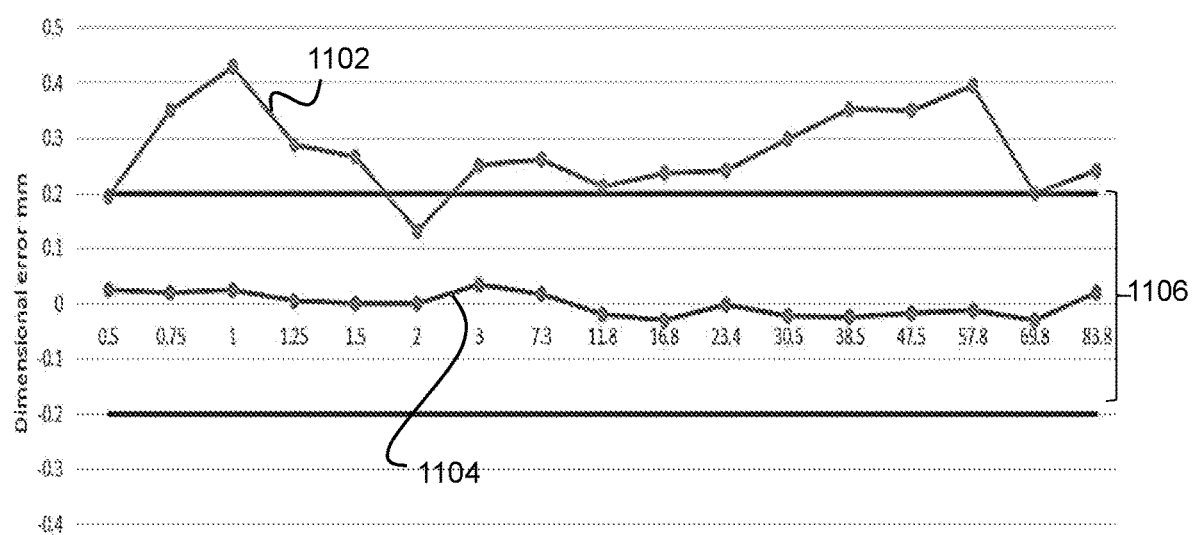
FIG. 11 is an example showing dimensional accuracies of voxel erosion methods.

FIG. 11 shows an example comparing a method in which a standard voxel erosion is applied (line 1102)—i.e. the same number of voxels is eroded from an entire slice perimeter- and a method carried out as set out herein, in which a local voxel erosion is based on a local temperature (line 1104). Also shown is an example tolerance 806, which in this example indicates that an object's dimensions should be within 0.2 mm of those specified in an original object model. As can be seen, by varying the voxel erosion based on the local temperature, the dimensions of the object may be more accurately produced.

Examples in the present disclosure can be provided as methods, systems or machine-readable instructions, such as any combination of software, hardware, firmware or the like. Such machine-readable instructions may be included on a computer readable storage medium (including but not limited to disc storage, CD-ROM, optical storage, etc.) having computer readable program codes therein or thereon.

The present disclosure is described with reference to flow charts and block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each block in the flow charts and/or block diagrams, as well as combinations of the blocks in the flow charts and/or block diagrams can be realized by machine readable instructions.

The machine-readable instructions may, for example, be executed by a general-purpose computer, a special purpose computer, an embedded processor or processors of other programmable data processing devices to realize the functions described in the description and diagrams. In particular, a processor or processing apparatus may execute the machine-readable instructions. Thus, functional modules of the apparatus (such as the heat analysis module 804, modification module 806, geometry analysis module 904 and/or the control data module 906) may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine-readable instructions may also be stored in a computer readable storage that can guide the computer or other programmable data processing devices to operate in a specific mode.

Such machine-readable instructions may also be loaded onto a computer or other programmable data processing devices, so that the computer or other programmable data processing device(s) perform a series of operations to produce computer-implemented processing, thus the instructions executed on the computer or other programmable devices realize functions specified by block(s) in the flow charts and/or in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

What is claimed is:

1. A method comprising:
    receiving, by a processor, object model data representing a portion of an object defining an initial object geometry, wherein the object is to be generated within a fabrication chamber by an additive manufacturing apparatus by fusing build material using a radiant heater;
    determining, by the processor, a non-uniform radiant heating distribution of the additive manufacturing apparatus by using a temperature sensor to monitor a temperature distribution of a heated calibration layer of build material applied within a build chamber of the additive manufacturing apparatus, and by comparing the monitored temperature distribution of the heated calibration layer of the build material to a baseline temperature distribution corresponding to uniform heating by the radiant heater;
    determining, by the processor, a first local radiant heating parameter from the non-uniform radiant heating distribution of the additive manufacturing apparatus for a first location in the fabrication chamber, and determining a second local radiant heating parameter from the non-uniform radiant heating distribution for a second location in the fabrication chamber;
    eroding or dilating, by the processor, an object model corresponding to the object model data by removing or adding a plurality of sub-volumes of a predetermined size from or to at least one outer surface of the object model;
    determining, by the processor, object generation instructions for generating the object in accordance with the eroded or dilated object model, the object generation instructions specifying an amount of print agent to be applied to each of a plurality of locations on a layer of build material; and
    causing, by the processor, the additive manufacturing apparatus to physically generate the object in accordance with the determined object generation instructions,
    wherein a number of sub-volumes eroded or added proximate the first location in the fabrication chamber when the object is generated within the fabrication chamber in accordance with the eroded or dilated object model is based on the first local radiant heating parameter,
    and wherein a number of sub-volumes eroded or added proximate the second location when the object is generated within the fabrication chamber in accordance with the eroded or dilated object model is based on the second local radiant heating parameter.

2. The method of claim 1, comprising:
    analyzing, by the processor, the object model data to determine a first predicted object generation temperature for the first location and a second predicted object generation temperature for the second location,
    wherein the first predicted object generation temperature is determined in part based on the first local radiant heating parameter and the second predicted object generation temperature is determined in part based on the second local radiant heating parameter.

3. The method of claim 1, wherein the numbers of sub-volumes to erode or add proximate the first location and the second location respectively are determined as a function of the respective first and second local radiant heating parameters obtained from the non-uniform radiant heating distribution, and are independent of a predicted temperature distribution in build material owing to object generation.

4. The method of claim 1, wherein the object model data is defined as a plurality of voxels.

5. A system comprising:
a processor; and
a memory storing instructions executable by the processor to:
receive object model data representing a portion of an object to be generated within a fabrication chamber by an additive manufacturing apparatus using a radiant heater;
determine a non-uniform radiant heating distribution of the additive manufacturing apparatus by using a temperature sensor to monitor a temperature distribution of a heated calibration layer of build material applied within a build chamber of the additive manufacturing apparatus, and by comparing the monitored temperature distribution of the heated calibration layer of the build material to a baseline temperature distribution corresponding to uniform heating by the radiant heater;
determine a first local radiant heating parameter from the non-uniform radiant heating distribution of the additive manufacturing apparatus for a first location in the fabrication chamber, and determine a second local radiant heating parameter from the non-uniform radiant heating distribution for a second location in the fabrication chamber;
erode or dilate an object model corresponding to the object model data by removing or adding a plurality of sub-volumes of a predetermined size from or to at least one outer surface of the object model;
determine object generation instructions for generating the object in accordance with the eroded or dilated object model, the object generation instructions specifying an amount of print agent to be applied to each of a plurality of locations on a layer of build material; and
cause the additive manufacturing apparatus to physically generate the object in accordance with the determined object generation instructions,
wherein a number of sub-volumes eroded or added proximate the first location in the fabrication chamber when the object is generated within the fabrication chamber in accordance with the eroded or dilated object model is based on the first local radiant heating parameter,
and wherein a number of sub-volumes eroded or added proximate the second location when the object is generated within the fabrication chamber in accordance with the eroded or dilated object model is based on the second local radiant heating parameter.

6. The apparatus of claim 5, wherein the instructions are executable by the processor to further:
analyze the object model data to determine a first predicted object generation temperature for the first location and a second predicted object generation temperature for the second location,
wherein the first predicted object generation temperature is determined in part based on the first local radiant heating parameter and the second predicted object generation temperature is determined in part based on the second local radiant heating parameter.

7. The apparatus of claim 5, wherein the numbers of sub-volumes to erode or add proximate the first location and the second location respectively are determined as a function of the respective first and second local radiant heating parameters obtained from the non-uniform radiant heating distribution, and are independent of a predicted temperature distribution in build material owing to object generation.

8. The apparatus of claim 5, wherein the object model data is defined as a plurality voxels.

9. A non-transitory machine readable medium storing instructions which, when executed by a processor, cause the processor to:
receive object model data representing a portion of an object to be generated within a fabrication chamber by an additive manufacturing apparatus using a radiant heater;
determine a non-uniform radiant heating distribution of the additive manufacturing apparatus by using a temperature sensor to monitor a temperature distribution of a heated calibration layer of build material applied within a build chamber of the additive manufacturing apparatus, and by comparing the monitored temperature distribution of the heated calibration layer of the build material to a baseline temperature distribution corresponding to uniform heating by the radiant heater;
determine a first local radiant heating parameter from the non-uniform radiant heating distribution of the additive manufacturing apparatus for a first location in the fabrication chamber, and determine a second local radiant heating parameter from the non-uniform radiant heating distribution for a second location in the fabrication chamber;
erode or dilate an object model corresponding to the object model data by removing or adding a plurality of sub-volumes of a predetermined size from or to at least one outer surface of the object model;
determine object generation instructions for generating the object in accordance with the eroded or dilated object model, the object generation instructions specifying an amount of print agent to be applied to each of a plurality of locations on a layer of build material; and
cause the additive manufacturing apparatus to physically generate the object in accordance with the determined object generation instructions,
wherein a number of sub-volumes eroded or added proximate the first location in the fabrication chamber when the object is generated within the fabrication chamber in accordance with the eroded or dilated object model is based on the first local radiant heating parameter,
and wherein a number of sub-volumes eroded or added proximate the second location when the object is generated within the fabrication chamber in accordance with the eroded or dilated object model is based on the second local radiant heating parameter.

10. The non-transitory machine readable medium of claim 9, wherein the instructions further cause the processor to:
analyze the object model data to determine a first predicted object generation temperature for the first location and a second predicted object generation temperature for the second location,
wherein the first predicted object generation temperature is determined in part based on the first local radiant heating parameter and the second predicted object generation temperature is determined in part based on the second local radiant heating parameter.

11. The non-transitory machine readable medium of claim 9, wherein the numbers of sub-volumes to erode or add proximate the first location and the second location respectively are determined as a function of the respective first and second local radiant heating parameters obtained from the non-uniform radiant heating distribution, and are independent of a predicted temperature distribution in build material owing to object generation.

\* \* \* \* \*